(12) United States Patent
Ohgishi

(10) Patent No.: US 7,560,341 B2
(45) Date of Patent: Jul. 14, 2009

(54) SEMICONDUCTOR DEVICE AND MANUFACTURING METHOD THEREFOR

(75) Inventor: Yuko Ohgishi, Tokyo (JP)

(73) Assignee: Sony Corporation, Tokyo (JP)

( * ) Notice: Subject to any disclaimer, the term of this patent is extended or adjusted under 35 U.S.C. 154(b) by 339 days.

(21) Appl. No.: 11/624,346

(22) Filed: Jan. 18, 2007

(65) Prior Publication Data

US 2007/0117325 A1 May 24, 2007

Related U.S. Application Data

(62) Division of application No. 10/839,403, filed on May 5, 2004.

(30) Foreign Application Priority Data

May 30, 2003 (JP) ............................ P2003-154687

(51) Int. Cl.
*H01L 21/00* (2006.01)
(52) U.S. Cl. ..................... 438/264; 438/261; 438/257
(58) Field of Classification Search ................. 437/264, 437/261, 257
See application file for complete search history.

(56) References Cited

U.S. PATENT DOCUMENTS

| | | | |
|---|---|---|---|
| 4,818,714 A | 4/1989 | Haskell | |
| 4,878,100 A | 10/1989 | McDavid | |
| 5,518,940 A | 5/1996 | Hodate | |
| 5,563,093 A * | 10/1996 | Koda et al. .................. | 438/231 |
| 5,950,090 A | 9/1999 | Chen | |
| 6,133,094 A * | 10/2000 | Shimamoto et al. .......... | 438/261 |
| 6,610,569 B1 * | 8/2003 | Shimamoto et al. .......... | 438/257 |
| 6,614,064 B1 * | 9/2003 | Besser et al. ................ | 257/213 |
| 7,067,382 B2 * | 6/2006 | Nakaoka et al. ............. | 438/301 |
| 7,119,412 B2 * | 10/2006 | Yamamoto ................... | 257/500 |
| 7,122,849 B2 * | 10/2006 | Doris et al. .................. | 257/288 |
| 7,355,256 B2 * | 4/2008 | Togo et al. ................... | 257/391 |
| 2001/0039096 A1 | 11/2001 | Tran | |
| 2001/0046695 A1 | 11/2001 | Lee | |
| 2002/0155665 A1 * | 10/2002 | Doris et al. .................. | 438/279 |

(Continued)

FOREIGN PATENT DOCUMENTS

JP 03-078259 4/1991

(Continued)

OTHER PUBLICATIONS

Japanese Office Action corresponding to JP 2003-15687 issued on Jul. 11, 2006.

*Primary Examiner*—Laura M Menz
(74) *Attorney, Agent, or Firm*—Sonnenschein Nath & Rosenthal LLP

(57) ABSTRACT

The gate electrode of a high-voltage transistor having a high breakdown voltage is formed from a polysilicon layer having a larger average grain size, so that depletion of the gate electrode easily occurs. By utilizing this depletion, the electrical effective film thickness required by the gate dielectric film of the transistor can be increased. In contrast, the gate electrode of a high-performance transistor needs to have a high speed and a large drive current is formed from a polysilicon layer having a smaller average grain size, so that depletion of the gate electrode hardly occurs. Accordingly, the electrical effective film thickness of the gate dielectric film of the transistor can be maintained at a small value.

4 Claims, 12 Drawing Sheets

U.S. PATENT DOCUMENTS

| | | | |
|---|---|---|---|
| 2003/0057501 A1 | 3/2003 | Miyanaga | |
| 2004/0075148 A1 | 4/2004 | Kumagai | |
| 2004/0238898 A1* | 12/2004 | Ohgishi | 257/379 |
| 2005/0236671 A1* | 10/2005 | Schuele et al. | 257/347 |
| 2006/0065934 A1* | 3/2006 | Okayama et al. | 257/365 |
| 2006/0197120 A1* | 9/2006 | Surdeanu et al. | 257/288 |
| 2006/0228885 A1* | 10/2006 | Saito | 438/650 |
| 2006/0283380 A1* | 12/2006 | Lee et al. | 117/89 |
| 2007/0057331 A1* | 3/2007 | Satou et al. | 257/384 |
| 2007/0117325 A1* | 5/2007 | Ohgishi | 438/264 |

FOREIGN PATENT DOCUMENTS

| | | |
|---|---|---|
| JP | 05-075036 | 3/1993 |
| JP | 11-297848 | 10/1999 |
| JP | 11297848 A * | 10/1999 |

\* cited by examiner

F I G. 2 E
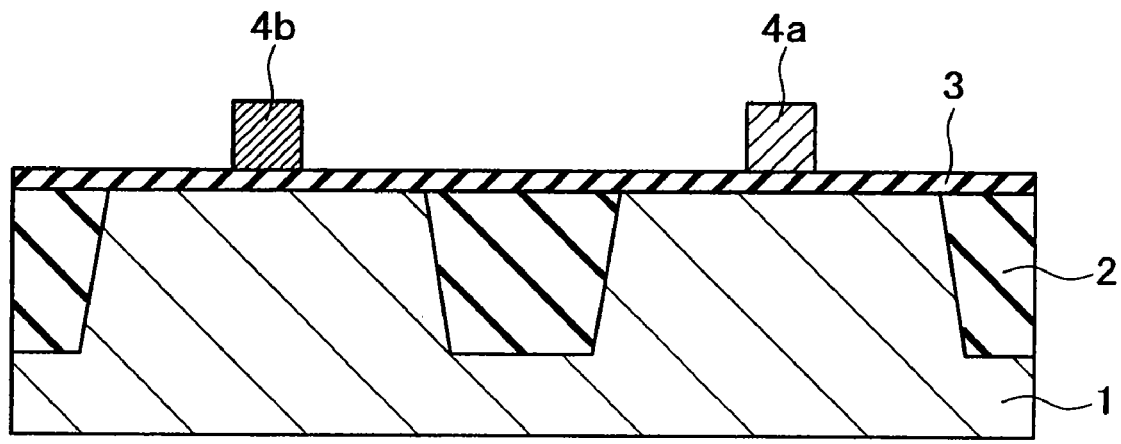
F I G. 2 F
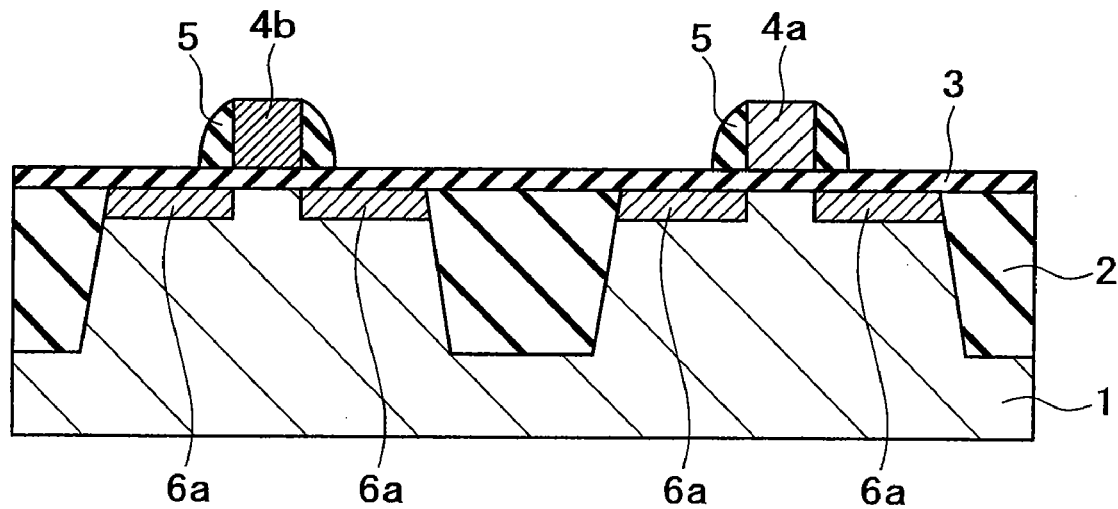

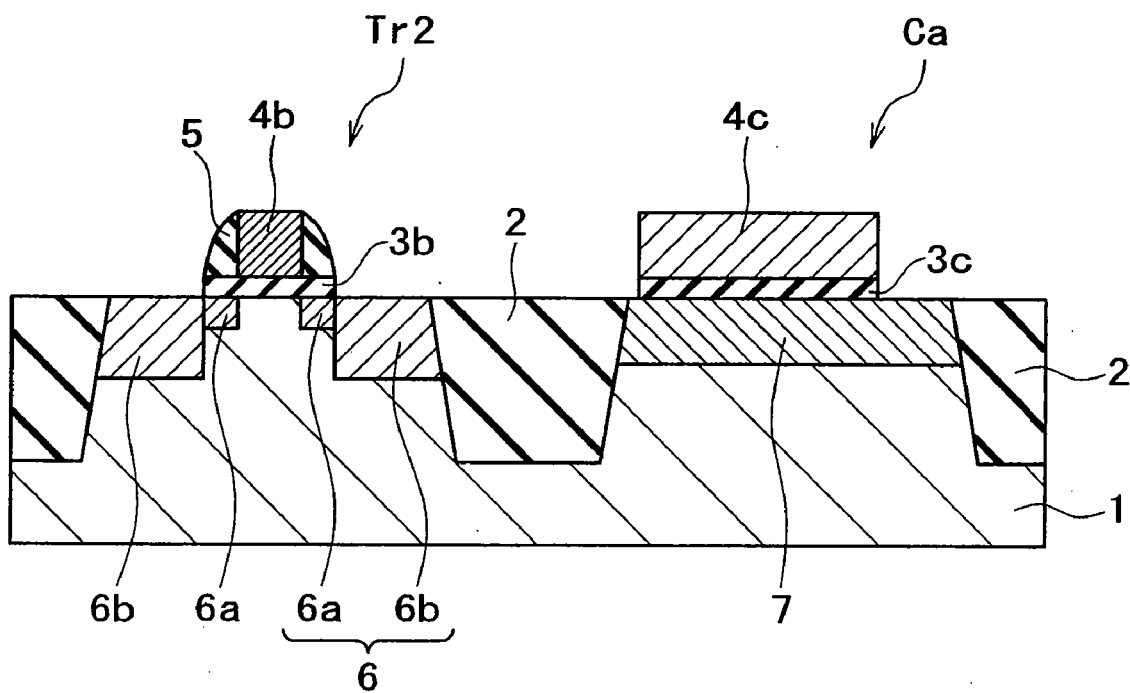

F I G. 6 A
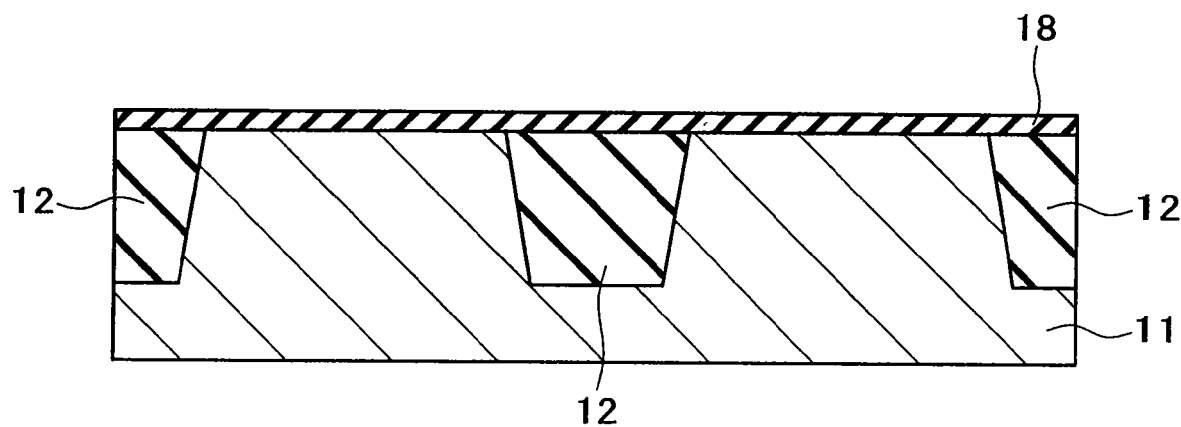
F I G. 6 B
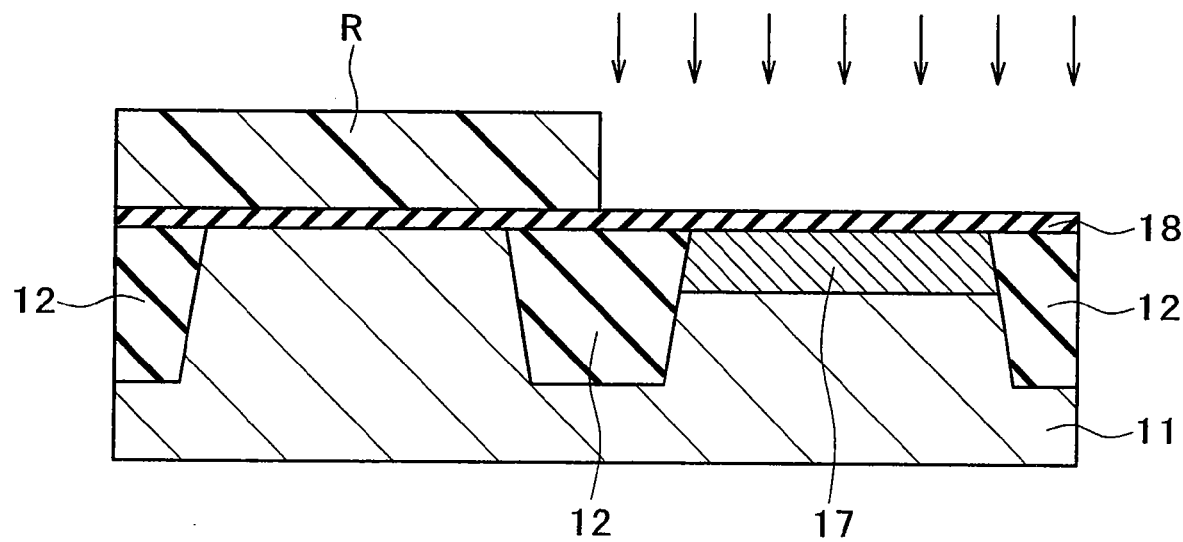

SEMICONDUCTOR DEVICE AND MANUFACTURING METHOD THEREFOR

RELATED APPLICATION

The present application is a divisional application of co-pending U.S. application Ser. No. 10/839,403 filed on May 5, 2004, which is incorporated herein by reference to the extent permitted by law.

This application also claims the benefit of priority to Japanese Application No. P2003-154687, filed May 30, 2003, which is also incorporated herein by reference to the extent permitted by law.

BACKGROUND OF THE INVENTION

The present invention relates to a semiconductor device and a manufacturing method therefor, and more particularly to a semiconductor device including different types of electronic elements such as a MOS transistor and a capacitor using different supply voltages formed on the same substrate, and a manufacturing method for such a semiconductor device.

In a recent LSI process, high integration of circuits and fine fabrication of electronic elements have been generally advanced. In association therewith, it has become necessary to simultaneously fabricate different types of electronic elements such as a MOS transistor, capacitor, and resistor using different supply voltages on the same substrate with an increase in number of steps minimized.

Further, finer fabrication is required to obtain a higher-performance MOS transistor, causing a reduction in supply voltage. This is accompanied by a thinner gate oxide film in this MOS transistor. Although a main MOS transistor is formed from a thin film, another MOS transistor to which a high voltage is applied for use in an I/O portion or an analog circuit is required to have a thicker oxide film according to a higher supply voltage.

In fabricating such different types of MOS transistors using different supply voltages, it is general to separately form gate oxide films having physically different film thicknesses. A fabrication method for such gate oxide films having physically different film thicknesses is shown in FIGS. 5A to 5D.

As shown in FIG. 5A, an oxide film 13 is formed by thermal oxidation on a semiconductor substrate 11 in which isolation dielectric films 12 are formed to isolate individual elements. As shown in FIG. 5B, only a region for fabricating a transistor employing a thick gate oxide film is masked with a photoresist R.

As shown in FIG. 5C, a portion of the oxide film 13 unmasked with the photoresist R is removed by wet etching using hydrofluoric acid or the like. After removing the photoresist R, thermal oxidation is performed again to form gate oxide films 13a and 13b having different film thicknesses as shown in FIG. 5D. The total film thickness of the gate oxide film 13a obtained by the first thermal oxidation and the second thermal oxidation is not equal to the sum of the film thickness of the oxide film 13 obtained by the first thermal oxidation and the film thickness of the oxide film obtained by the second thermal oxidation. Accordingly, optimum thermal oxidation is performed as the first thermal oxidation so that a desired film thickness is totally obtained.

By repeating the photoresist patterning step, the wet etching step, and the subsequent thermal oxidation step as mentioned above, different film thicknesses of oxide films can be further obtained.

Further, simultaneous fabrication of a MOS transistor and a capacitor is known conventionally. Such a fabrication method is shown in FIGS. 6A to 6D.

As shown in FIG. 6A, a suitable sacrificial oxide film 18 is formed by thermal oxidation on a semiconductor substrate 11 in which isolation dielectric film 12 are formed to isolate individual elements. As shown in FIG. 6B, a transistor forming region is masked with a photoresist R, and a high concentration of impurity ions is implanted through the sacrificial oxide film 18 into the semiconductor substrate 11 to thereby form an n.sup.+ semiconductor region or a p.sup.+ semiconductor region as one electrode 17 of the capacitor.

After removing the photoresist R and the sacrificial oxide film 18, a gate oxide film 13b of the MOS transistor and a capacitive oxide film 13c of the capacitor are simultaneously formed by thermal oxidation as shown in FIG. 6C. The capacitive oxide film 13c has a desired film thickness. This thermal oxidation is accelerated by crystal defects produced in the region where the impurity ions have been implanted with a high concentration (accelerated oxidation), so that the capacitive oxide film 13c becomes thicker than the gate oxide film 13b. Thereafter, polysilicon is deposited over the semiconductor substrate 11 and next patterned to thereby simultaneously form a gate electrode 14b of the MOS transistor and another electrode 14c of the capacitor as shown in FIG. 6D.

In this method, the MOS transistor and the capacitor can be formed on the same substrate simultaneously and efficiently without largely increasing the number of steps.

It is known that depletion under a gate electrode can be prevented by increasing an impurity concentration in the gate electrode (see Japanese Patent Laid-open No. 2000-277626).

However, the above-mentioned methods have the following problems.

In the case of separately forming oxide films having physically different film thicknesses, there arises a problem that the number of steps increases according to the different film thicknesses to be obtained. Further, in the wet etching step, the etching liquid such as hydrofluoric acid penetrates at the edges of the oxide film masked with the photoresist, causing damage to the oxide film to be left. As a result, any adverse effects are produced in the related transistor, thus possibly causing a reduction in reliability. Accordingly, heavy use of this method is undesirable.

In the case of simultaneously forming the transistor and the capacitor, a thicker oxide film can be obtained in the capacitor by performing ion implantation with a high dosage in forming the electrode in the semiconductor substrate of Si to thereby accelerate the subsequent thermal oxidation. However, such high-dosage ion implantation may cause a large damage to the semiconductor substrate, so that the quality of the oxide film is reduced to cause a reduction in reliability.

As mentioned above, in obtaining a high-performance MOS transistor as a main transistor for LSI, a physically thin gate oxide film is essential, and an electrical effective film thickness of this oxide film in operating the transistor must be maintained at a small value. Accordingly, it is necessary to meet the individual requirements of the thin-film transistor and the electronic elements requiring different oxide film thicknesses, such as a transistor and a capacitor using different supply voltages.

SUMMARY OF THE INVENTION

It is accordingly an object of the present invention to provide a semiconductor device which can ensure the electrical effective film thickness required by the dielectric film of each electronic element by utilizing the depletion of the electrode of each electronic element without the need for making a difference in physical film thickness between the dielectric films of the electronic elements.

It is another object of the present invention to provide a manufacturing method for a semiconductor device which can eliminate the need for separate formation of the dielectric films having physically different film thicknesses and can ensure different electrical effective film thicknesses required by the dielectric films of the electronic elements.

In accordance with an aspect of the present invention, there is provided a semiconductor device including a semiconductor substrate; and a plurality of electronic elements formed on the semiconductor substrate, each of the electronic elements having an electrode and a dielectric film interposed between the semiconductor substrate and the electrode; the dielectric films of the electronic elements having different electrical effective film thicknesses required; wherein the electrodes of the electronic elements have different average grain sizes according to the different electrical effective film thicknesses of the dielectric films of the electronic elements; and the different electrical effective film thicknesses are controlled by depletion of the electrodes due to the different average grain sizes.

With this configuration, the average gain sizes of the electrodes are different from each other according to the electrical effective film thicknesses required by the dielectric films of the electronic elements. Accordingly, the effective film thicknesses of the dielectric films can be controlled by the depletion of the electrodes due to the different average grain sizes, so that the different effective film thicknesses required by the dielectric films of the electronic elements can be obtained.

In accordance with another aspect of the present invention, there is provided a manufacturing method for a semiconductor device including a semiconductor substrate and a plurality of electronic elements formed on the semiconductor substrate, each of the electronic elements having an electrode and a dielectric film interposed between the semiconductor substrate and the electrode; the dielectric films of the electronic elements having different electrical effective film thicknesses required; the manufacturing method including the steps of: forming the dielectric film on the semiconductor substrate; forming an amorphous semiconductor layer on the dielectric film; converting the amorphous semiconductor layer into a polycrystalline semiconductor layer so that the polycrystalline semiconductor layer has a plurality of regions having different average grain sizes so as to respectively correspond to the plurality of electronic elements; and processing the polycrystalline semiconductor layer to form a plurality of polycrystalline electrodes from the regions having the different average grain sizes.

With this configuration, the amorphous semiconductor layer is converted into a polycrystalline semiconductor layer so that the polycrystalline semiconductor layer has a plurality of regions having different average grain sizes so as to respectively correspond to the plurality of electronic elements.

In the region having a larger average grain size, the electrical effective film thickness of the dielectric film of the electronic element is larger. When the average grain size is increased, the grain boundaries are reduced to suppress the diffusion of impurities in the electrode. Accordingly, the depletion of the electrode easily occurs and the electrical effective film thickness is therefore larger.

In the region having a smaller average grain size, the grain boundaries are increased to promote the diffusion of impurities in the electrode. Accordingly, the depletion of the electrode hardly occurs and the electrical effective film thickness is therefore maintained at a small value.

According to the semiconductor device of the present invention, there is no difference in physical film thickness between the dielectric films of the electronic elements, but the electrical effective film thickness required by the dielectric film of each electronic element can be ensured by utilizing the depletion of the electrode of each electronic element.

According to the manufacturing method for the semiconductor device of the present invention, it is possible to suppress an increase in number of steps due to the separate formation of the dielectric films having different physical film thicknesses and to fabricate the plural electronic elements having the dielectric films different in required electrical effective film thickness on the same substrate.

Other objects and features of the invention will be more fully understood from the following detailed description and appended claims when taken with the accompanying drawings.

BRIEF DESCRIPTION OF THE DRAWINGS

FIGS. 2A to 2F are sectional views showing a manufacturing method for the semiconductor device shown in FIG. 1;

FIG. 3 is a sectional view of a semiconductor device according to a second preferred embodiment of the present invention;

FIGS. 6A to 6D are sectional views showing a method of simultaneously fabricating a transistor and a capacitor in the prior art.

DETAILED DESCRIPTION OF THE PREFERRED EMBODIMENTS

Some preferred embodiments of the present invention will now be described with reference to the drawings.

First Preferred Embodiment

Figure 1:
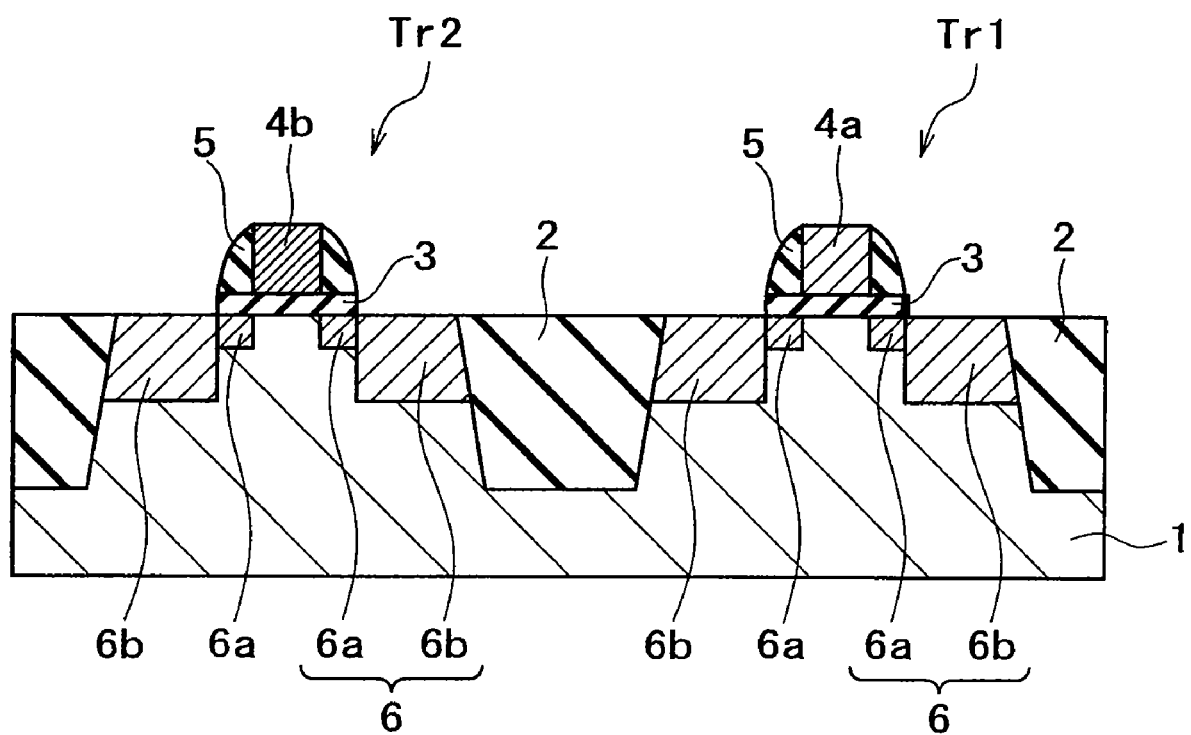
FIG. 1 is a sectional view of a semiconductor device according to a first preferred embodiment of the present invention.

FIG. 1 is a sectional view of a semiconductor device according to a first preferred embodiment of the present invention.

As shown in FIG. 1, isolation dielectric films 2 of silicon oxide, for example, are formed in a semiconductor substrate 1 of silicon, for example, and active regions are defined in the semiconductor substrate 1 by the isolation dielectric films 2. In the active regions defined in the semiconductor substrate 1, two different types of transistors Tr1 and Tr2 are formed. The transistors Tr1 and Tr2 serve as electronic elements to which different supply voltages are applied. That is, the transistor Tr1 serves as a high-voltage transistor to which a high supply voltage is applied, and the transistor Tr2 serves as a high-performance transistor having a high speed and a large drive current.

Gate electrodes 4a and 4b of the transistors Tr1 and Tr2 are formed on the semiconductor substrate 1 in the active regions through gate dielectric films 3, respectively, and sidewall dielectric films 5 of silicon oxide, for example, are formed on the side surfaces of the gate electrodes 4a and 4b. In this preferred embodiment, the physical film thickness of the gate dielectric film 3 of the transistor Tr1 is substantially the same as that of the gate dielectric film 3 of the transistor Tr2. The gate electrode 4a is formed from a larger grain size, polysilicon layer having a larger average grain size, and the gate electrode 4b is formed from a smaller grain size, polysilicon layer having a smaller average grain size. In this preferred embodiment, the larger grain size means an average grain size of 200 nm or more, and the smaller grain size means an average grain size of about 50 to 100 nm.

In the semiconductor substrate 1 at positions just under the sidewall dielectric films 5 of the transistors Tr1 and Tr2, n.sup.− semiconductor regions 6a doped with a low concentration of impurities are formed. Further, in the semiconductor substrate 1 at positions laterally outside of the n.sup.− semiconductor regions 6a, n.sup.+ semiconductor regions 6b doped with a high concentration of impurities are formed. Thus, source/drain regions 6 having LDD (Lightly Doped Drain) structures each composed of the n.sup.− semiconductor region 6a and the n.sup.+ semiconductor region 6b are formed in each of the transistors Tr1 and Tr2.

In the semiconductor device according to this preferred embodiment, the gate electrode 4a of the high-voltage transistor Tr1 to which a high supply voltage is applied is formed from a larger grain size, polysilicon layer having a larger average grain size. Accordingly, depletion of the gate electrode 4a easily occurs upon application of a gate voltage. This is due to the fact that in the larger grain size, polysilicon layer, the grain boundaries are reduced as compared with the smaller grain size, polysilicon layer, so that the diffusion of impurities in the gate electrode 4a is suppressed. The depletion of the gate electrode 4a is equivalent to increasing the film thickness of the gate dielectric film 3 in the high-voltage transistor Tr1. Although the high-voltage transistor Tr1 is required to have a thicker gate dielectric film 3, an electrical effective film thickness required by the gate dielectric film 3 can be increased by utilizing the depletion of the gate electrode 4a.

In contrast, the gate electrode 4b of the high-performance transistor Tr2 required to have a high speed and a large drive current is formed from a smaller grain size, polysilicon layer having a smaller average grain size. Accordingly, the grain boundaries are increased to cause easy diffusion of impurities in the gate electrode 4b. As a result, depletion of the gate electrode 4b hardly occurs upon application of a gate voltage, and the electrical effective film thickness of the gate dielectric film 3 in the transistor Tr2 is maintained at a small value. Accordingly, hindrance to a high-speed operation due to the depletion of the gate electrode 4b can be prevented to thereby realize a high speed and a large drive current.

A manufacturing method for the semiconductor device according to the first preferred embodiment mentioned above will now be described with reference to FIGS. 2A to 2F.

Figure 2A:
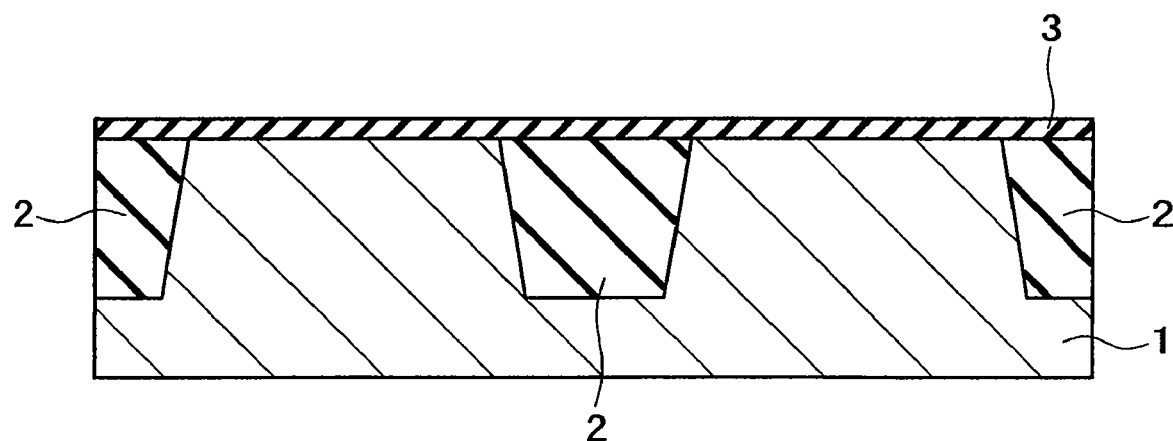

As shown in FIG. 2A, a gate dielectric film 3 having a thickness of about 2 nm, for example, is formed by thermal oxidation on a semiconductor substrate 1 in which isolation dielectric films 2 are formed by LOCOS (Local Oxidation of Silicon) or STI (Shallow Trench Isolation) to thereby define active regions. The oxidation conditions in this thermal oxidation are set so that the film thickness of the oxide film becomes small according to the high-performance transistor Tr2.

Figure 2B:
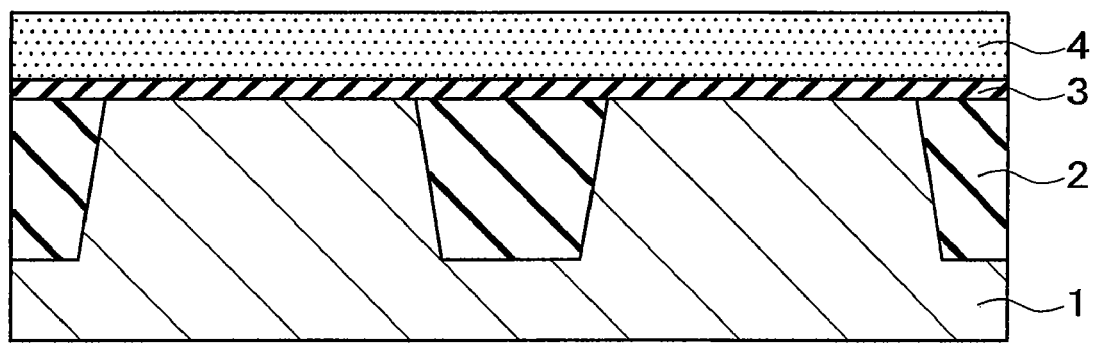

As shown in FIG. 2B, amorphous silicon is deposited on the gate dielectric film 3 to form an amorphous silicon layer 4. The film thickness of the amorphous silicon layer 4 is set to about 50 to 200 nm, for example.

Figure 2C:
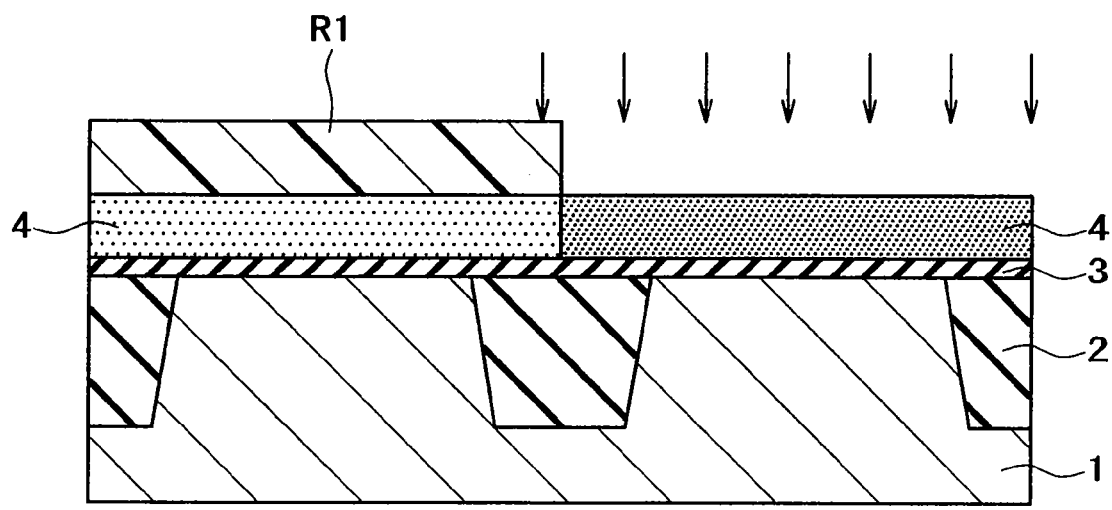

As shown in FIG. 2C, a resist R1 is patterned so as to open a region including the gate electrode 4a of the high-voltage transistor Tr1 to be formed later, and silicon ions are implanted into the amorphous silicon layer 4 by using the resist R1 as a mask. This implantation of silicon ions is performed with an implantation energy of 100 keV and a dose of 3.times.10.sup.15 to 5.times.10.sup.15 cm.sup.−2. The reason for this implantation of silicon ions is to retard the starting time for solid-phase epitaxy of the amorphous silicon layer 4 by annealing to be performed later. Such impurities having the above function are not limited to silicon ions, but include phosphorus ions and nitrogen ions.

Figure 2D:
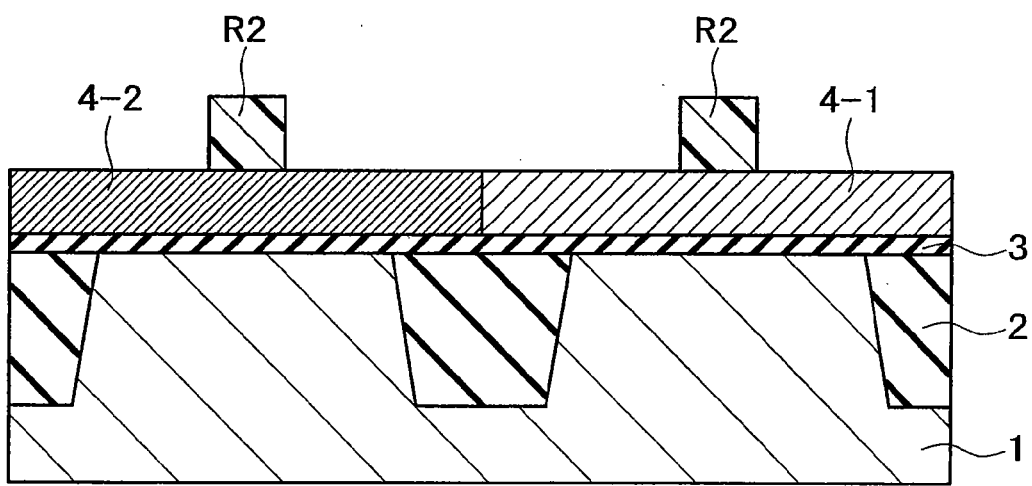

As shown in FIG. 2D, the resist R1 is removed, and annealing is next performed at a low temperature for a long time to thereby cause solid-phase epitaxy of the amorphous silicon layer 4, thus making the amorphous silicon layer 4 polycrystalline. As a result, a larger grain size, polysilicon layer 4-1 and a smaller grain size, polysilicon layer 4-2 are obtained. The annealing mentioned above is performed at 600.degree. C. for about 20 hours in an atmosphere of nitrogen, for example.

The larger grain size, polysilicon layer 4-1 is formed by utilizing the following property. In the region of the amorphous silicon layer 4 where silicon ions have been implanted, the starting time for solid-phase epitaxy of the amorphous silicon layer 4 by annealing is retarded more with an increase in the amount of the ions implanted. Accordingly, even at the time the amorphous silicon layer 4 in the other region where no silicon ions have been implanted are aggregated by annealing to become polycrystalline, the degree of aggregation in the amorphous silicon layer 4 in the region where silicon ions have been implanted is still low, so that a larger average grain size is obtained in this region.

Thereafter, resists R2 are formed as masks by lithography at positions where the gate electrodes 4a and 4b of the transistors Tr1 and Tr2 are to be formed later.

As shown in FIG. 2E, the polysilicon layers 4-1 and 4-2 are dry-etched by using the resists R2 as masks. Thereafter, the resists R2 are removed. As a result, the gate electrode 4a is formed from the larger grain size, polysilicon layer 4-1, and the gate electrode 4b is formed from the smaller grain size, polysilicon layer 4-2.

As shown in FIG. 2F, a low concentration of phosphorus ions as an example of n-type impurities is implanted into the semiconductor substrate 1 by using the gate electrodes 4a and 4b as masks to thereby form n.sup.− semiconductor regions 6a. Thereafter, a silicon oxide film, for example, is deposited and next etched back to thereby form sidewall dielectric films 5 on the side surfaces of the gate electrodes 4a and 4b.

As the subsequent step, a high concentration of phosphorus ions as an example of n-type impurities is implanted into the semiconductor substrate 1 by using the gate electrodes 4a and 4b and the sidewall dielectric films 5 as masks to thereby form n.sup.+ semiconductor regions 6b as shown in FIG. 1. As a result, source/drain regions 6 having LDD structures are formed. Finally, portions of the gate dielectric film 3 present on the source/drain regions 6 are removed to thereby manufacture the semiconductor device shown in FIG. 1.

According to the manufacturing method for the semiconductor device according to this preferred embodiment, the larger grain size, polysilicon layer 4-1 formed by implanting impurities to retard the starting time for solid-phase epitaxy by annealing is used for the gate electrode 4a of the high-voltage transistor Tr1. Accordingly, the depletion of the gate electrode 4a easily occurs and the gate dielectric film 3 in the transistor Tr1 can be obtained with a larger electrical effective film thickness.

In contrast, the smaller grain size, polysilicon layer 4-2 is used for the gate electrode 4b of the high-performance transistor Tr2, so that the electrical effective film thickness of the gate dielectric film 3 in the transistor Tr2 can be maintained at a small value.

Accordingly, the transistors Tr1 and Tr2 of different types can be fabricated efficiently and simultaneously on the same substrate with the performance of each transistor being maintained.

Second Preferred Embodiment

There will now be described a semiconductor device according to a second preferred embodiment wherein a transistor and a capacitor are formed on the same substrate. In the second preferred embodiment, the same parts as those in the first preferred embodiment are denoted by the same reference numerals, and the description thereof will be omitted herein. FIG. 3 is a sectional view of the semiconductor device according to the second preferred embodiment.

As shown in FIG. 3, a high-performance transistor Tr2 having a high speed and a large drive current is formed in one active region of a semiconductor substrate 1, and a capacitor Ca is formed in the other active region of the semiconductor substrate 1.

The capacitor Ca is composed of a lower electrode 7 formed in the semiconductor substrate 1 and containing a high concentration of n-type impurities, for example, a capacitive dielectric film 3c formed on the lower electrode 7, and an upper electrode (capacitor electrode) 4c formed on the capacitive dielectric film 3c.

In this preferred embodiment, the gate dielectric film 3b of the transistor Tr2 and the capacitive dielectric film 3c of the capacitor Ca are formed simultaneously, and their physical film thicknesses are substantially equal to each other.

The gate electrode 4b of the transistor Tr2 is formed from a smaller grain size, polysilicon layer having a smaller average grain size, and the upper electrode 4c of the capacitor Ca is formed from a larger grain size, polysilicon layer having a larger average grain size. The gate electrode 4b and the upper electrode 4c are formed simultaneously.

In the semiconductor device according to this preferred embodiment, the upper electrode 4c of the high-voltage capacitor Ca having a high breakdown voltage according to a capacitor voltage is formed from a larger grain size, polysilicon layer having a larger average grain size. Accordingly, depletion of the upper electrode 4c easily occurs upon application of a voltage. The depletion of the upper electrode 4c is equivalent to increasing the film thickness of the capacitive dielectric film 3c. Although the capacitor Ca is required to have a thicker capacitive dielectric film whose thickness is large enough to withstand a high voltage, an electrical effective film thickness required by the capacitive dielectric film 3c can be increased by utilizing the depletion of the upper electrode 4c.

In contrast, the gate electrode 4b of the high-performance transistor Tr2 required to have a high speed and a large drive current is formed from a smaller grain size, polysilicon layer having a smaller average grain size, in which depletion of the gate electrode 4b hardly occurs, so that the electrical effective film thickness of the gate dielectric film 3b is maintained at a small value. Accordingly, hindrance to a high-speed operation due to the depletion of the gate electrode 4b can be prevented to thereby realize a high speed and a large drive current.

A manufacturing method for the semiconductor device according to the second preferred embodiment mentioned above will now be described with reference to FIGS. 4A to 4F.

Figure 4A:
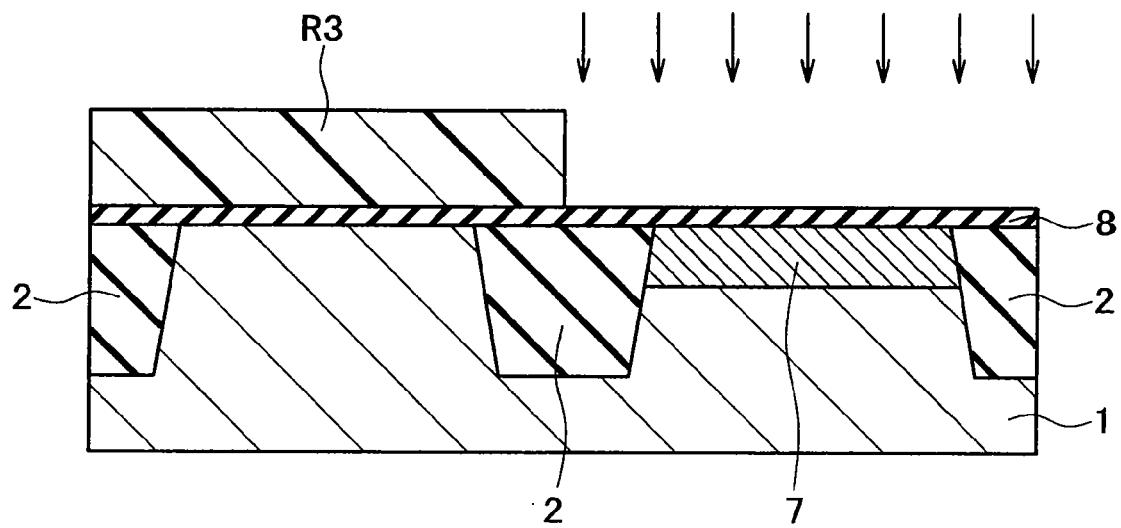
FIGS. 4A to 4F are sectional views showing a manufacturing method for the semiconductor device shown in FIG. 3.

As shown in FIG. 4A, a sacrificial film 8 of silicon oxide is formed by thermal oxidation on a semiconductor substrate 1 in which isolation dielectric films 2 are formed by LOCOS or STI to thereby define active regions. The film thickness of the sacrificial film 8 is set to about 8 nm, for example. Thereafter, a resist R3 is patterned so as to open a capacitor forming region, and impurity ions are implanted into the semiconductor substrate 1 by using the resist R3 as a mask to thereby form a lower electrode 7. While the dosage in this ion implantation is set so as to form a sufficient n+ or p+ doped region in the semiconductor substrate 1, an increase in gate leakage current or an increase in crystal defect due to excess dosage must be avoided to ensure reliability. For example, arsenic ions as the impurity ions are implanted with an implantation energy of 70 keV and a dose of $1 \times 10^{15}$ cm$^{-2}$.

Figure 4B:
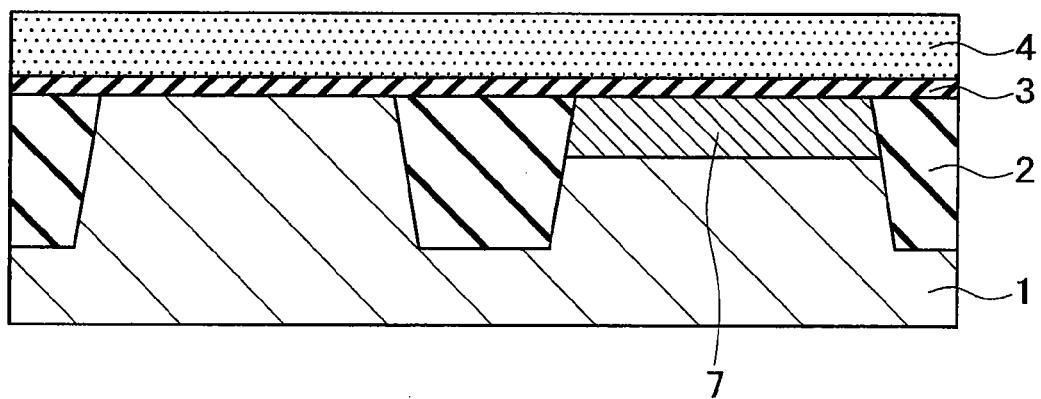

As shown in FIG. 4B, the resist R3 is removed and the sacrificial film 8 is also removed by using hydrofluoric acid or the like. Thereafter, a dielectric film 3 is formed by thermal oxidation on the semiconductor substrate 1 as the gate electric film 3b of the transistor Tr2 and the capacitive dielectric film 3c of the capacitor Ca to be formed later for each. The oxidation conditions in this thermal oxidation are set so that the film thickness of the oxide film becomes small according to the high-performance transistor Tr2.

Thereafter, amorphous silicon is deposited on the dielectric film 3 by CVD to form an amorphous silicon layer 4 having a film thickness of about 50 to 200 nm, for example.

The subsequent steps are similar to the steps shown in FIGS. 2C to 2F of the first preferred embodiment.

Figure 4C:
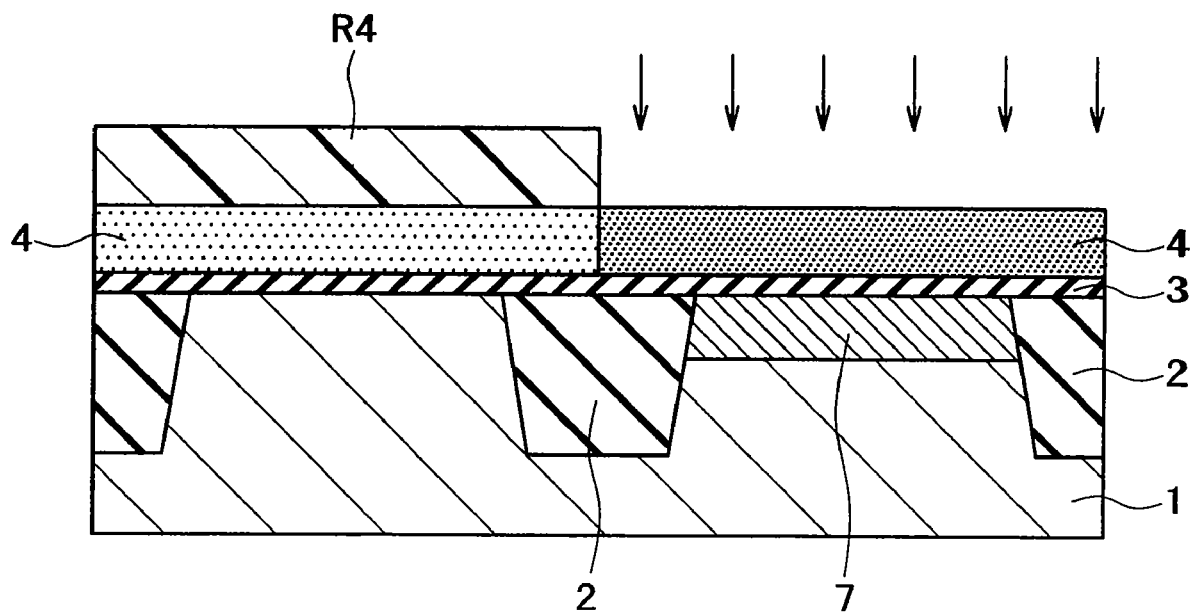

As shown in FIG. 4C, a resist R4 is patterned so as to open a region including the upper electrode 4c of the high-voltage capacitor Ca to be formed later, and silicon ions are implanted into the amorphous silicon layer 4 by using the resist R4 as a mask. The conditions for this ion implantation are similar to those in the first preferred embodiment. Further, silicon ions may be replaced by phosphorus or nitrogen ions.

Figure 4D:
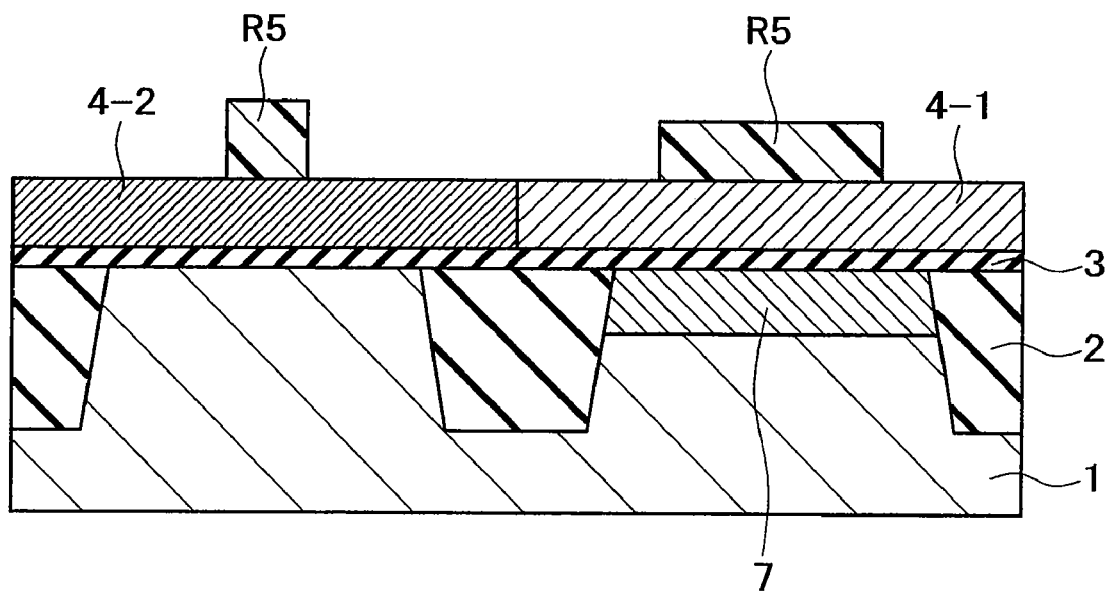

As shown in FIG. 4D, the resist R4 is removed, and annealing is next performed at a low temperature for a long time to thereby cause solid-phase epitaxy of the amorphous silicon layer 4, thus making the amorphous silicon layer 4 polycrystalline. As a result, a larger grain size, polysilicon layer 4-1 and a smaller grain size, polysilicon layer 4-2 are obtained on the principle similar to that in the first preferred embodiment. The annealing mentioned above is performed at about 600.degree. C. for about 20 hours in an atmosphere of nitrogen, for example.

Thereafter, resists R5 are formed as masks by lithography at positions where the gate electrode 4b of the transistor Tr2 and the upper electrode 4c of the capacitor Ca are to be formed later.

Figure 4E:
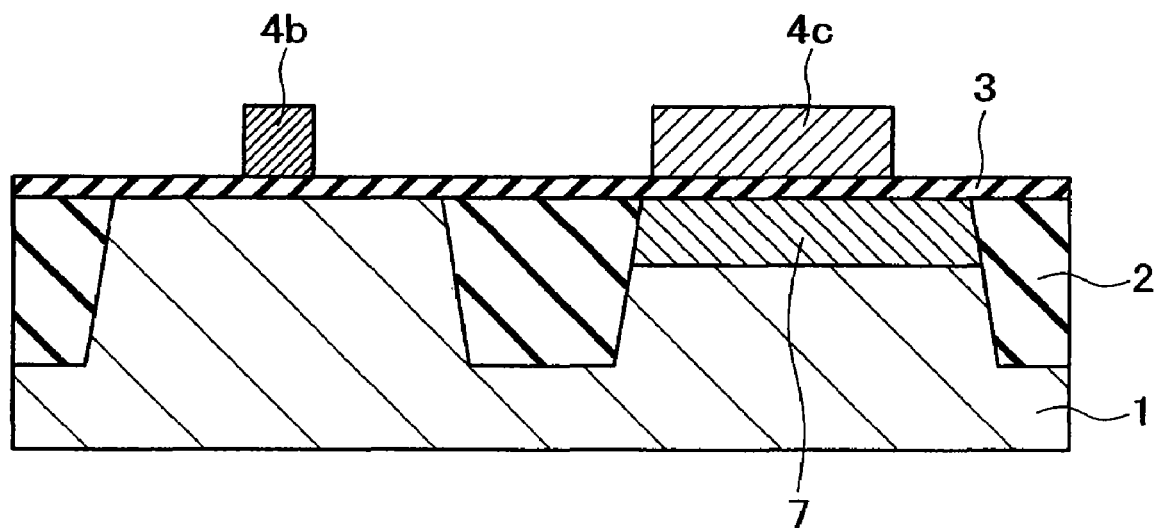

As shown in FIG. 4E, the polysilicon layers 4-1 and 4-2 are dry-etched by using the resists R5 as masks. Thereafter, the resists R5 are removed. As a result, the upper electrode 4c is formed from the larger grain size, polysilicon layer 4-1, and the gate electrode 4b is formed from the smaller grain size, polysilicon layer 4-2.

Figure 4F:
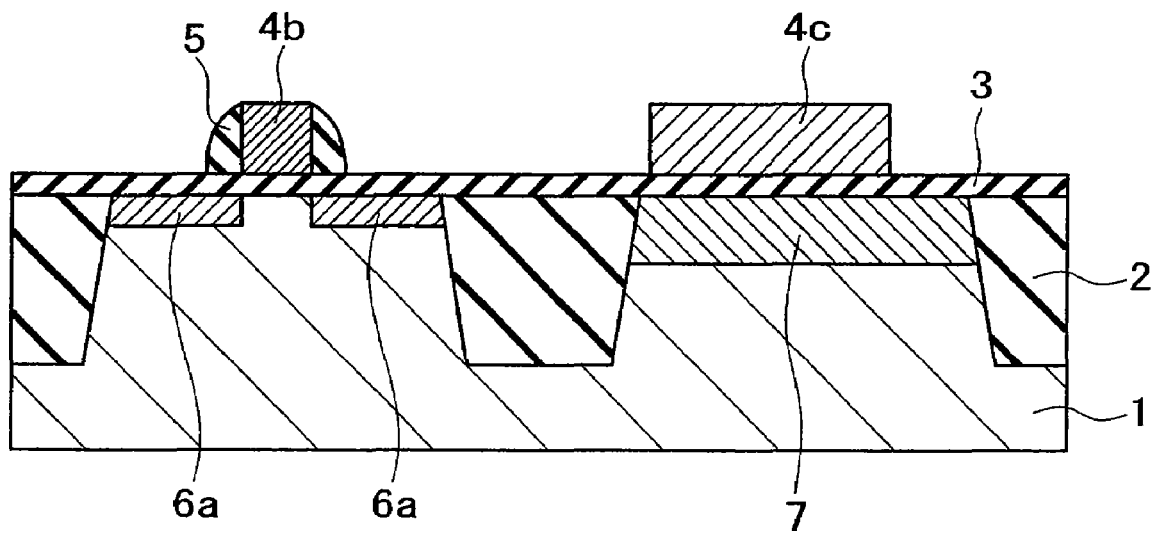
Figure 5A:
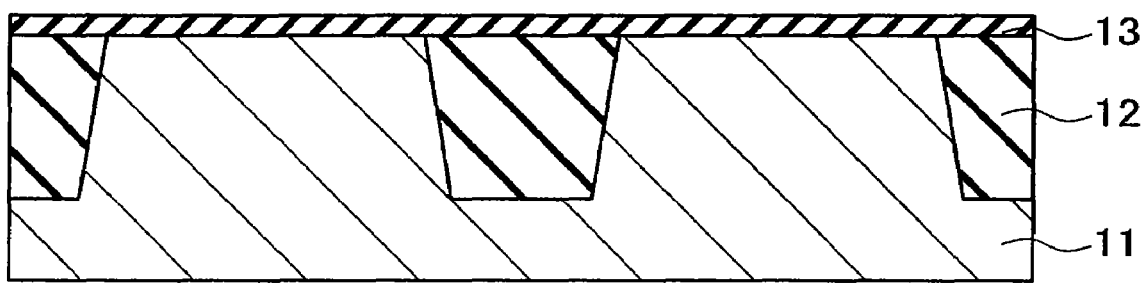
FIGS. 5A to 5D are sectional views showing a fabrication method for dielectric films having different film thicknesses in the prior art.
Figure 5B:
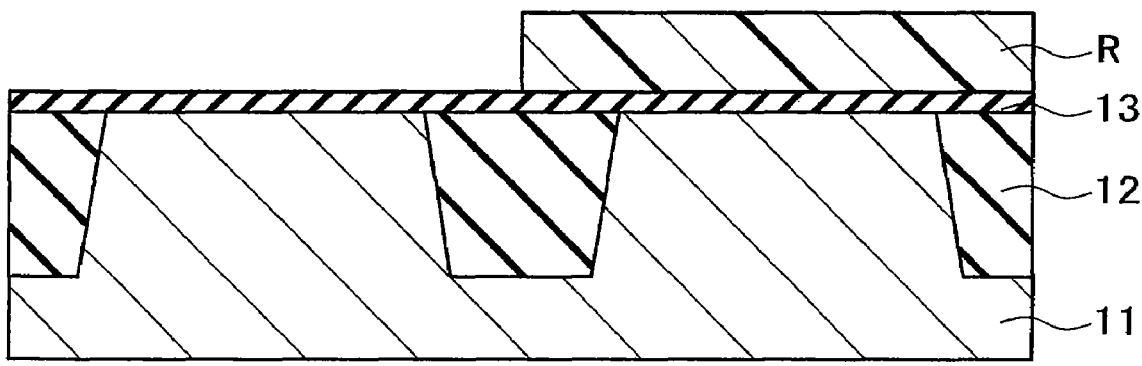
Figure 5C:
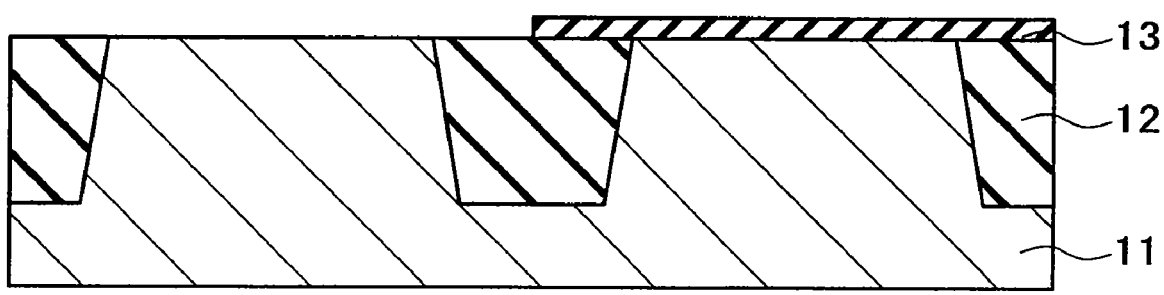
Figure 5D:
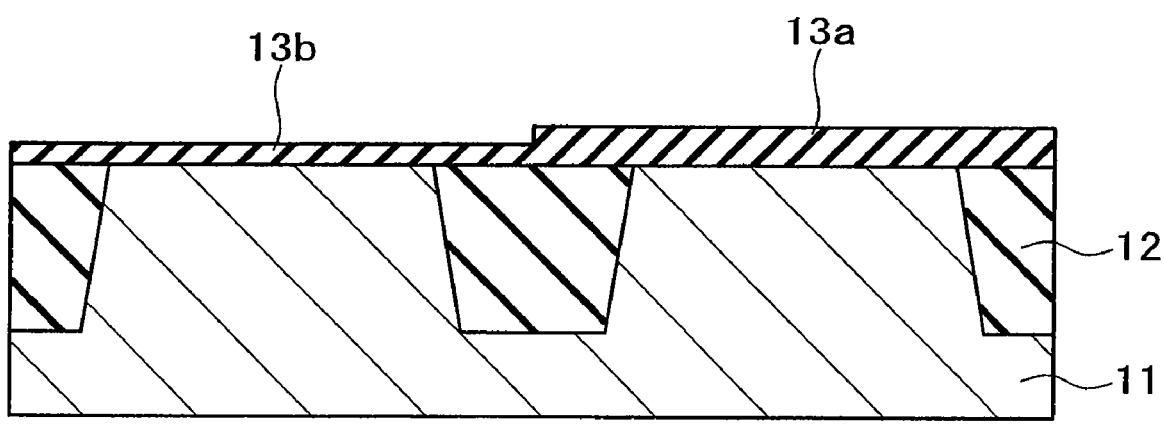
Figure 6C:
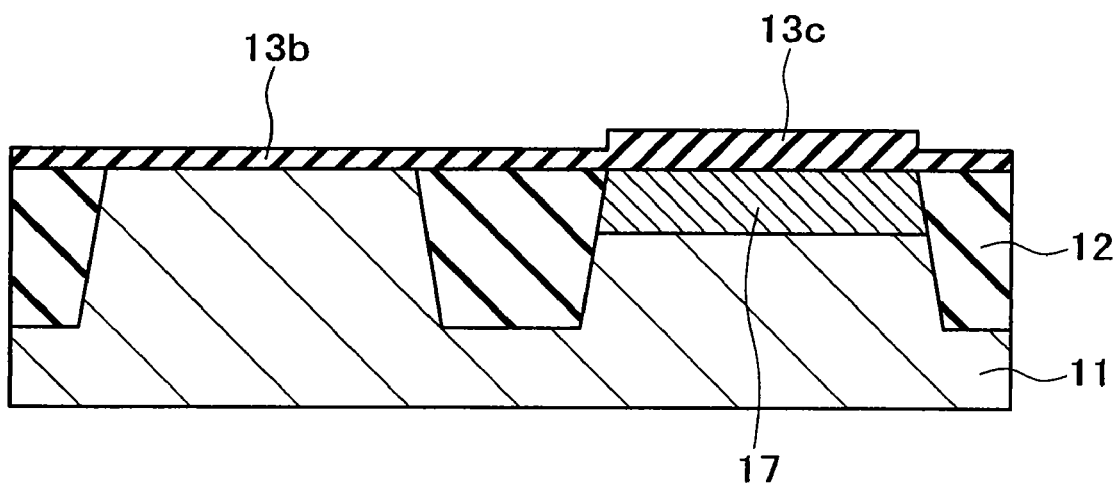
Figure 6D:
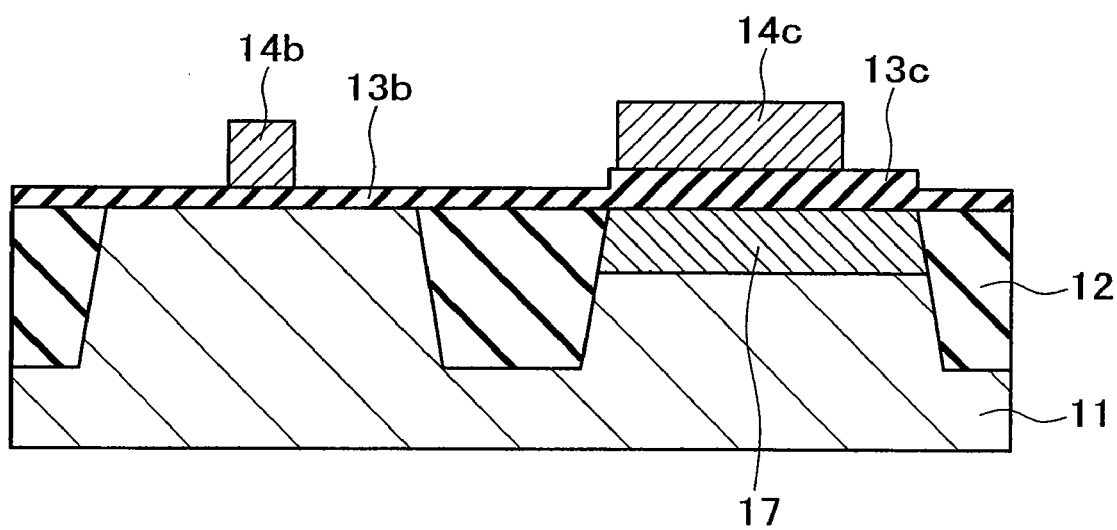

As shown in FIG. 4F, a low concentration of phosphorus ions as an example of n-type impurities is implanted into the semiconductor substrate 1 by using the gate electrode 4b as a mask in the condition where the capacitor forming region is masked with a resist (not shown), thereby forming n$^-$ semiconductor regions 6a in the transistor forming region. After removing this resist, a silicon oxide film, for example, is deposited and next etched back to thereby form a sidewall dielectric film 5 on the side surface of the gate electrode 4b.

As the subsequent step, a high concentration of phosphorus ions as an example of n-type impurities is implanted into the semiconductor substrate 1 by using the gate electrode 4b and the sidewall dielectric film 5 as masks in the condition where the capacitor forming region is masked with a resist (not shown), thereby forming n.sup.+ semiconductor regions 6b in the transistor forming region as shown in FIG. 3. As a result, source/drain regions 6 having LDD structures are formed. Finally, an exposed portion of the dielectric film 3 is removed to obtain the gate dielectric film 3b of the transistor Tr2 and the capacitive dielectric film 3c of the capacitor Ca, thereby manufacturing the semiconductor device shown in FIG. 3.

According to the manufacturing method for the semiconductor device according to this preferred embodiment, the larger grain size, polysilicon layer 4-1 is formed by implanting impurities to retard the starting time for solid-phase epitaxy by annealing, and the upper electrode 4c of the capacitor Ca is formed from this larger grain size, polysilicon layer 4-1. Accordingly, the depletion of the upper electrode 4c easily occurs and the capacitive dielectric film 3c of the capacitor Ca can be obtained with a larger electrical effective film thickness.

In contrast, the smaller grain size, polysilicon layer 4-2 is used for the gate electrode 4b of the high-performance transistor Tr2, so that the electrical effective film thickness of the gate dielectric film 3b can be maintained at a small value.

Accordingly, the high-performance transistor Tr2 and the capacitor Ca using different supply voltages can be fabricated efficiently and simultaneously on the same substrate with the performance of the transistor Tr2 being maintained.

Third Preferred Embodiment

In the fabrication of the transistors having the gate dielectric films different in electrical effective film thickness as described in the first preferred embodiment, the formation of the polysilicon layers having different average grain sizes is attained by laser annealing in the third preferred embodiment. The third preferred embodiment is different from the first preferred embodiment in only the steps shown in FIGS. 2C and 2D, so only different steps will now be described and the description of the other steps will be omitted herein.

In the step shown in FIG. 2C, a metal mask R1 is formed so as to open a region including the gate electrode 4a of the high-voltage transistor Tr1 to be formed later and to protect the other region, and laser light is directed to the amorphous silicon layer 4 with the metal mask R1 used as a mask. For example, excimer laser light having a wavelength of 248.7 nm is directed by adopting such as flash lamp annealing.

Accordingly, the exposed portion of the amorphous silicon layer 4 is melted by irradiation with the laser light, and the melted silicon layer 4 is solidified in a planar direction to effect crystal growth, thereby obtaining a larger grain size, polysilicon layer 4-1 having a larger average grain size and excellent uniformity.

As shown in FIG. 2D, the metal mask R1 is removed, and annealing is next performed at a low temperature for a long time to thereby cause solid-phase epitaxy of the remaining unirradiated portion of the amorphous silicon layer 4, thus making this portion polycrystalline. As a result, a smaller grain size, polysilicon layer 4-2 corresponding to this portion is obtained. In this manner, the larger grain size, polysilicon layer 4-1 is formed in the region for forming the transistor Tr1 and the smaller grain size, polysilicon layer 4-2 is formed in the region for forming the transistor Tr2. The annealing for obtaining the polysilicon layer 4-2 is performed at about 600.degree. C. for about 20 hours in an atmosphere of nitrogen, for example.

As a modification, the annealing for obtaining the polysilicon layer 4-2 may be performed before the laser annealing for obtaining the polysilicon layer 4-1. In this case, the annealing for obtaining the polysilicon layer 4-2 is suitably performed at a temperature less than or equal to a crystallization temperature, e.g., at 350 to 500.degree. C. for about 1 hour.

Thereafter, resists R2 are formed as masks by lithography at positions where the gate electrodes 4a and 4b of the transistors Tr1 and Tr2 are to be formed later. Thereafter, the steps shown in FIGS. 2E and 2F are carried out as in the first preferred embodiment, thereby manufacturing the semiconductor device according to the third preferred embodiment.

According to the manufacturing method for the semiconductor device according to this preferred embodiment, the larger grain size, polysilicon layer 4-1 is formed by the crystal growth effected by irradiation with laser light, and the gate electrode 4a of the high-voltage transistor Tr1 is formed from the larger grain size, polysilicon layer 4-1. Accordingly, the depletion of the gate electrode 4a easily occurs and the gate dielectric film 3 in the transistor Tr1 can be obtained with a larger electrical effective film thickness.

In contrast, the smaller grain size, polysilicon layer 4-2 is formed by annealing, and the gate electrode 4b of the high-performance transistor Tr2 is formed from the smaller grain size, polysilicon layer 4-2. Accordingly, the electrical effective film thickness of the gate dielectric film 3 in the transistor Tr2 can be maintained at a small value.

Accordingly, the transistors Tr1 and Tr2 of different types can be fabricated efficiently and simultaneously on the same substrate with the performance of each transistor being maintained.

Fourth Preferred Embodiment

In the fabrication of the transistor having the gate dielectric film and the capacitor having the capacitive dielectric film different in electrical effective film thickness as described in the second preferred embodiment, the formation of the polysilicon layers having different average grain sizes is attained by laser annealing in the fourth preferred embodiment. The fourth preferred embodiment is different from the second preferred embodiment in only the steps shown in FIGS. 4C and 4D, so only different steps will now be described and the description of the other steps will be omitted herein.

In the step shown in FIG. 4C, a metal mask R4 is formed so as to open a region including the upper electrode 4c of the high-voltage capacitor Ca to be formed later and to protect the other region, and laser light is directed to the amorphous silicon layer 4 with the metal mask R4 used as a mask. For example, excimer laser light having a wavelength of 248.7 nm is directed by adopting such as flash lamp annealing.

Accordingly, the exposed portion of the amorphous silicon layer 4 is melted by irradiation with the laser light, and the melted silicon layer 4 is solidified in a planar direction to effect crystal growth, thereby obtaining a larger grain size, polysilicon layer 4-1 having a larger average grain size and excellent uniformity.

As shown in FIG. 4D, the metal mask R4 is removed, and annealing is next performed at a low temperature for a long time to thereby cause solid-phase epitaxy of the remaining unirradiated portion of the amorphous silicon layer 4, thus making this portion polycrystalline. As a result, a smaller grain size, polysilicon layer 4-2 corresponding to this portion is obtained. In this manner, the larger grain size, polysilicon layer 4-1 is formed in the region for forming the capacitor Ca and the smaller grain size, polysilicon layer 4-2 is formed in the region for forming the transistor Tr2. The annealing for obtaining the polysilicon layer 4-2 is performed at about 600.degree. C. for about 20 hours in an atmosphere of nitrogen, for example.

As a modification, the annealing for obtaining the polysilicon layer 4-2 may be performed before the laser annealing for obtaining the polysilicon layer 4-1. In this case, the annealing for obtaining the polysilicon layer 4-2 is suitably performed at a temperature less than or equal to a crystallization temperature, e.g., at 350 to 500.degree. C. for about 1 hour.

Thereafter, resists R5 are formed as masks by lithography at positions where the upper electrode 4c of the capacitor Ca and the gate electrode 4b of the transistor Tr2 are to be formed later. Thereafter, the steps shown in FIGS. 4E and 4F are carried out as in the second preferred embodiment, thereby manufacturing the semiconductor device according to the fourth preferred embodiment.

According to the manufacturing method for the semiconductor device according to this preferred embodiment, the larger grain size, polysilicon layer 4-1 is formed by the crystal growth effected by irradiation with laser light, and the upper electrode 4c of the high-voltage capacitor Ca is formed from the larger grain size, polysilicon layer 4-1. Accordingly, the depletion of the upper electrode 4c easily occurs and the capacitive dielectric film 3c in the capacitor Ca can be obtained with a larger electrical effective film thickness.

In contrast, the smaller grain size, polysilicon layer 4-2 is formed by annealing, and the gate electrode 4b of the high-performance transistor Tr2 is formed from the smaller grain size, polysilicon layer 4-2. Accordingly, the electrical effective film thickness of the gate dielectric film 3b in the transistor Tr2 can be maintained at a small value.

Accordingly, the capacitor Ca and the transistor Tr2 using different supply voltages can be fabricated efficiently and simultaneously on the same substrate with the performance of the transistor Tr2 being maintained.

The present invention is not limited to the above preferred embodiments. While the transistors Tr1 and Tr2 are simultaneously formed on the same substrate in the first and third preferred embodiments and the capacitor Ca and the transistor Tr2 are simultaneously formed on the same substrate in the second and fourth preferred embodiments, the transistors Tr1 and Tr2 and the capacitor Ca may be simultaneously formed on the same substrate.

Further, the method of separately forming the gate dielectric films in the transistors as described with reference to FIGS. 5A to 5D may be applied in combination. While the transistors Tr1 and Tr2 and the capacitor Ca have been described as examples of the semiconductor device, the present invention is not limited to these examples. For example, the sidewall dielectric films may be omitted.

Further, the numeric values and materials mentioned in the above preferred embodiments are merely illustrative, and the present invention is not limited thereto.

Various modifications may be made without departing from the scope of the present invention.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A manufacturing method for a semiconductor device including a semiconductor substrate and a plurality of electronic elements formed on said semiconductor substrate, each of said electronic elements having an electrode and a dielectric film interposed between said semiconductor substrate and said electrode, said dielectric films of said electronic elements having different electrical effective film thicknesses required, said manufacturing method comprising the steps of:

forming said dielectric film on said semiconductor substrate;

forming an amorphous semiconductor layer on said dielectric film;

converting said amorphous semiconductor layer into a polycrystalline semiconductor layer so that said polycrystalline semiconductor layer has a plurality of regions having different average grain sizes so as to respectively correspond to said plurality of electronic elements; and processing said polycrystalline semiconductor layer to form a plurality of polycrystalline electrodes from said regions having said different average grain sizes, wherein, said converting step comprises the steps of:

directing light having a predetermined energy to said amorphous semiconductor layer at a region thereof corresponding to said electronic element whose dielectric film has a larger electrical effective film thickness to thereby melt said amorphous semiconductor layer at said irradiated region and solidify said melted amorphous semiconductor layer at said irradiated region in a planar direction, thereby converting said irradiated region of said amorphous semiconductor layer into a first polycrystalline semiconductor layer having a larger average grain size, and annealing said amorphous semiconductor layer to thereby convert an unirradiated region of said amorphous semiconductor layer into a second polycrystalline semiconductor layer having a smaller average grain size.

2. A manufacturing method for a semiconductor device including a semiconductor substrate and a plurality of electronic elements formed on said semiconductor substrate, each of said electronic elements having an electrode and a dielectric film interposed between said semiconductor substrate and said electrode, said dielectric films of said electronic elements having different electrical effective film thicknesses required, said manufacturing method comprising the steps of:

forming said dielectric film on said semiconductor substrate;

forming an amorphous semiconductor layer on said dielectric film;

converting said amorphous semiconductor layer into a polycrystalline semiconductor layer so that said polycrystalline semiconductor layer has a plurality of regions having different average grain sizes so as to respectively correspond to said plurality of electronic elements; and processing said polycrystalline semiconductor layer to form a plurality of polycrystalline electrodes from said regions having said different average grain sizes, wherein, said converting step comprises the steps of:

annealing said amorphous semiconductor layer to thereby convert it into a polycrystalline semiconductor layer, and directing light having a predetermined energy to said polycrystalline semiconductor layer at a region thereof corresponding to said electronic element whose dielectric film has a larger electrical effective film thickness to thereby melt said polycrystalline semiconductor layer at said irradiated region and solidify said melted polycrystalline semiconductor layer at said irradiated region in a planar direction, thereby obtaining a polycrystalline semiconductor layer having a larger average grain size at said irradiated region.

3. A manufacturing method for a semiconductor device including a semiconductor substrate and a plurality of electronic elements formed on said semiconductor substrate, each of said electronic elements having an electrode and a dielectric film interposed between said semiconductor substrate and said electrode, said dielectric films of said electronic elements having different electrical effective film thicknesses required, said manufacturing method comprising the steps of:

forming said dielectric film on said semiconductor substrate;

forming an amorphous semiconductor layer on said dielectric film;

converting said amorphous semiconductor layer into a polycrystalline semiconductor layer so that said polycrystalline semiconductor layer has a plurality of regions having different average grain sizes so as to respectively correspond to said plurality of electronic elements; and processing said polycrystalline semiconductor layer to form a plurality of polycrystalline electrodes from said regions having said different average grain sizes, wherein, one of said electronic elements comprises a capacitor, and said manufacturing method further comprises the step of forming a lower electrode of said capacitor in said semiconductor substrate before said step of forming said dielectric film on said semiconductor substrate.

4. The manufacturing method according to claims 1, 2 or 3, wherein, said converting step further comprises the steps of:

introducing impurities for suppressing the promotion of crystal growth into said amorphous semiconductor layer at a region thereof corresponding to said electronic element whose dielectric film has a larger electrical effective film thickness; and annealing said amorphous semiconductor layer to convert it into a first polycrystalline semiconductor layer having a larger average grain size at said region where said impurities have been introduced and a second polycrystalline semiconductor layer having a smaller average grain size at the other region.

* * * * *